(12) United States Patent
Thuong et al.

(10) Patent No.: US 9,567,106 B2
(45) Date of Patent: Feb. 14, 2017

(54) SYSTEM AND METHOD FOR IDENTIFYING FAULTS IN AN AIRCRAFT

(71) Applicant: Taleris Global LLP, Chandlers Ford (GB)

(72) Inventors: Olivier Paul Jacques Thanh Minh Thuong, Southampton (GB); Robert William Horabin, Southampton (GB); Guy Edward Deshotel, Lewisville, TX (US); Mark John Robbins, Eastleigh (GB)

(73) Assignee: TALERIS GLOBAL LLP, Gloucestershire (GB)

(*) Notice: Subject to any disclaimer, the term of this patent is extended or adjusted under 35 U.S.C. 154(b) by 138 days.

(21) Appl. No.: 14/550,367

(22) Filed: Nov. 21, 2014

(65) Prior Publication Data

US 2016/0144983 A1    May 26, 2016

(51) Int. Cl.
*G01R 31/02*    (2006.01)
*G01R 31/08*    (2006.01)
(Continued)

(52) U.S. Cl.
CPC ............ *B64F 5/0045* (2013.01); *G01M 17/00* (2013.01); *G01R 31/02* (2013.01); *G01R 31/021* (2013.01);
(Continued)

(58) Field of Classification Search
CPC ..... G01R 27/18; G01R 27/2617; G01R 31/00; G01R 31/021; G01R 31/024; G01R 31/025; G01R 31/08; G01R 31/10; G01R 31/12; G01R 31/1272; G01R 31/28; G01R 31/31901; G01R 1/06; G01R 1/067; G01R 31/02; G01N 27/20; G01N 27/205; H04L 41/0677; G01M 17/00; G07C 5/0808; G07C 5/0816; B64D 2045/0085; B64F 5/0045
(Continued)

(56) References Cited

U.S. PATENT DOCUMENTS 8,838,328 B2 * 9/2014 Hardesty ............... F02D 41/22
                                                      701/29.1
9,449,438 B2    9/2016 Catt et al.
(Continued)

FOREIGN PATENT DOCUMENTS

EP    1455313 A1    9/2004
EP    2573367 A2    3/2013
(Continued)

OTHER PUBLICATIONS

European Search Report and Written Opinion issued in connection with corresponding EP Application No. 15195350.2 dated May 6, 2016.
(Continued)

*Primary Examiner* — Hoai-An D Nguyen
(74) *Attorney, Agent, or Firm* — GE Global Patent Operation; William S. Munnerlyn

(57) ABSTRACT

System and method of identifying a fault in an aircraft having at least one monitored system, including receiving operational data for the at least one monitored system during at least a portion of a flight, receiving user input data from a user input corresponding to the operation of the at least one monitored system, and identifying an actual fault condition, by a controller, when the user input data is determined to be symptomatic of the identified possible fault condition.

16 Claims, 2 Drawing Sheets

(51) Int. Cl.
*B64F 5/00* (2006.01)
*G07C 5/08* (2006.01)
*G01M 17/00* (2006.01)
*B64D 45/00* (2006.01)

(52) U.S. Cl.
CPC ........... *G01R 31/024* (2013.01); *G01R 31/025* (2013.01); *G01R 31/08* (2013.01); *G07C 5/0808* (2013.01); *G07C 5/0816* (2013.01); *B64D 2045/0085* (2013.01)

(58) Field of Classification Search
USPC ....... 324/500, 509, 512, 527, 528, 531, 541, 324/544, 555, 557, 503
See application file for complete search history.

(56) References Cited

U.S. PATENT DOCUMENTS

| 2010/0114411 A1 | 5/2010 | Schmidt |
| 2014/0336871 A1 | 11/2014 | Catt et al. |
| 2014/0336872 A1 | 11/2014 | Howard |

FOREIGN PATENT DOCUMENTS

| EP | 2772813 A2 | 9/2014 |
| JP | 01169601 A | 7/1989 |
| JP | 2014210574 A | 11/2014 |

OTHER PUBLICATIONS

JP Notice of Allowance issued on Nov. 8, 2016 in connection with corresponding JP Application 2015-223575.

\* cited by examiner

SYSTEM AND METHOD FOR IDENTIFYING FAULTS IN AN AIRCRAFT

BACKGROUND OF THE INVENTION

Contemporary aircraft have a number of systems and components that are utilized in order to operate the aircraft. Currently, airlines and maintenance personnel wait until a fault or problem occurs with the aircraft and then attempt to identify the cause and fix it during either scheduled or, more likely, unscheduled maintenance, which is highly undesirable as the aircraft must be taken out of service. Fault occurrences are also recorded manually based on pilot discretion.

BRIEF DESCRIPTION OF EMBODIMENTS OF THE INVENTION

In one embodiment, the invention relates to a method of identifying a fault in an aircraft having at least one monitored system, including receiving operational data from a plurality of sensors for the at least one monitored system during at least a portion of a flight, receiving user input data from a user input corresponding to the operation of the at least one monitored system, identifying a possible fault condition based on comparing the received operational data to at least one corresponding threshold, analyzing the user input data corresponding to the identified possible fault condition to determine when the user input data is symptomatic of the identified possible fault condition, identifying an actual fault condition, by a controller, when the user input data is determined to be symptomatic of the identified possible fault condition, and providing an indication of the identified fault condition.

In another embodiment, the invention relates to a system for identifying a fault in an aircraft having at least one aircraft component having at least one sensor outputting operational data for the at least one aircraft component, at least one user input device located on the aircraft and providing user input data corresponding to the operation of the at least one aircraft component, a controller receiving the user input data and the operational data, wherein the controller executes a computer program implementing an algorithm that identifies a possible fault condition of the at least one aircraft component based on the operational data, monitors the operational data corresponding to the identified possible fault condition for multiple uses of the at least one aircraft component, analyzes the user input data corresponding to the identified possible fault condition to determine when the user input data is symptomatic of the identified possible fault condition, identifies an actual fault condition when the user input data is determined to be symptomatic of the identified possible fault condition, and providing an indication of the identified fault condition

DESCRIPTION OF EMBODIMENTS OF THE INVENTION

Figure 1:
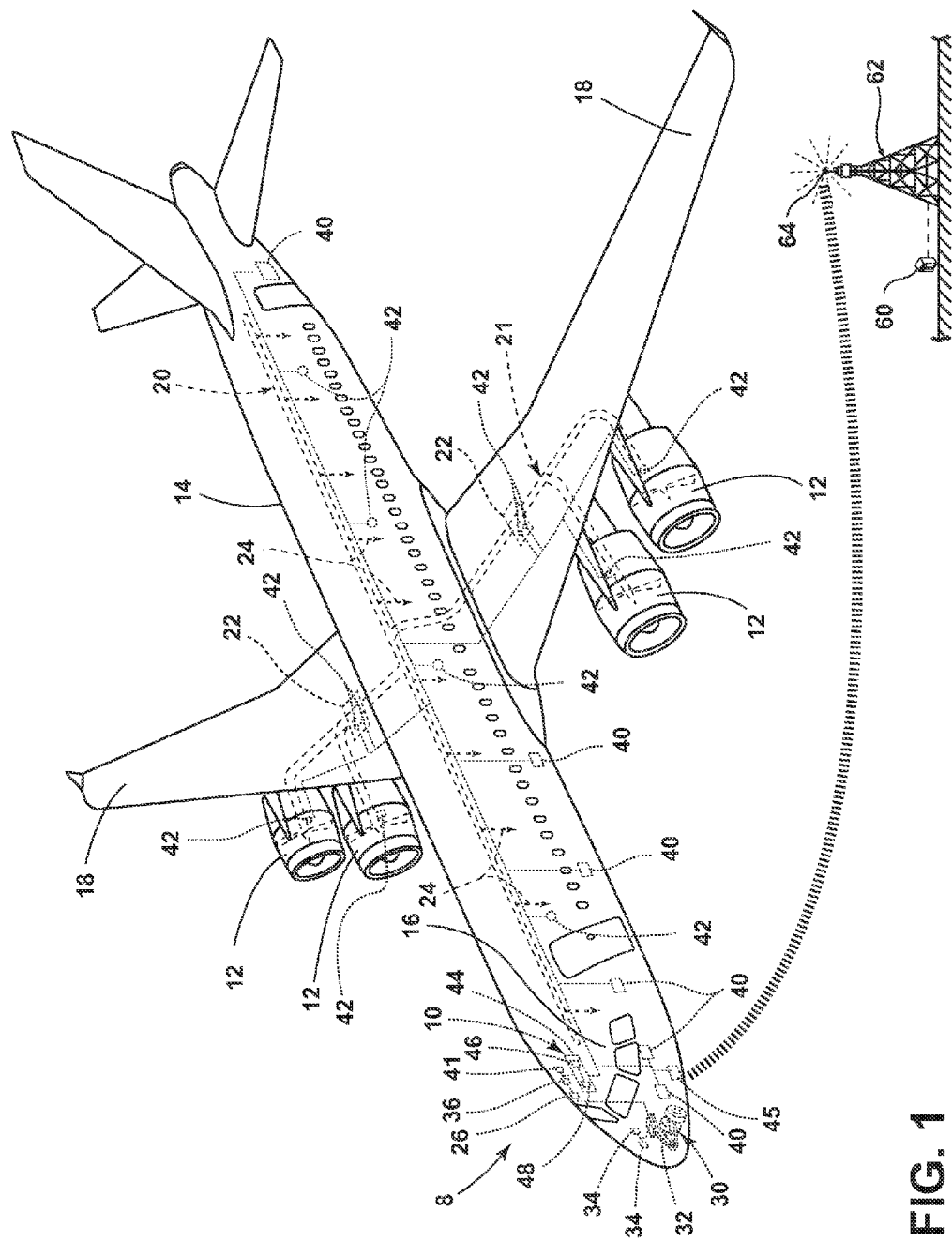
FIG. 1 is a perspective view of an aircraft and a ground system in which embodiments of the invention may be implemented.

FIG. 1 illustrates an aircraft 8 having a system 10 for identifying a fault in the aircraft 8. As illustrated, the aircraft 8 may include multiple engines 12 coupled to a fuselage 14, a cockpit 16 positioned in the fuselage 14, and wing assemblies 18 extending outward from the fuselage 14. While a commercial aircraft has been illustrated, it is contemplated that embodiments of the invention may be used in any type of aircraft, for example, without limitation, fixed-wing, rotating-wing, rocket, personal aircraft, and military aircraft. Further, while two engines 12 have been illustrated on each wing assembly 18, it will be understood that any number of engines 12 including a single engine 12 may be included.

A number of systems may be included in the aircraft 8 including an air-conditioning system 20, only a portion of which has been illustrated for clarity purposes. The air-conditioning system 20 may form a portion of the environmental control system of the aircraft 8 and may include a variety of subsystems. For example, among others, a bleed air system 21, one or more air-conditioning packs 22, and an air distribution system having various ducts 24 or cabin temperature control system 26 may be included in the air-conditioning system 20. The bleed air system 21 may be connected to each of the engines 12 and air may be supplied to the air-conditioning system 20 by being bled from a compressor stage of each engine 12, upstream of the combustor. Various bleed ports may be connected to various portions of the engine 12 to provide highly compressed air to the bleed air system 21. The temperature and pressure of this bleed air varies widely depending upon which compressor stage and the RPM of the engine 12. The cabin temperature control system 26 may act as a control mechanism and may control the temperatures within the aircraft 8 as well as a variety of other aspects of the air-conditioning system 20. A number of sensors may be included and may output signals related to various aspects of the air-conditioning system 20 including temperatures within the aircraft 8, pressures within the air-conditioning system 20, temperatures of physical portions of the air-conditioning system 20 including duct temperatures, position of trim air valves, a/k/a hot air valves, prior to mixing with cold pack outlet air, etc.

A nose wheel steering system or nose wheel system 30 has also been illustrated as being included and is illustrated as including nose wheel landing gear 32, multiple sensors 34, and a control mechanism 36, which may include a rudder or any other suitable control mechanism. The control mechanism 36 may be directly coupled to the nose wheel landing gear 32 or may be operably coupled through a controller. Nose wheel steering systems may be hydraulically actuated and may be either electrically or mechanically controlled. Steering on the aircraft may be accomplished by swiveling the lower portion of the nose wheel.

Further, a plurality of additional aircraft systems 40 that enable proper operation of the aircraft 8 may also be included in the aircraft 8 and have been schematically illustrated. A number of sensors 42 related to the systems of the aircraft, any subsystems or components, may also be included in the aircraft 8. It will be understood that any number of sensors 42 may be included and that any suitable type of sensors 42 may be included. The sensors 42 may transmit various output signals and information related to any of the systems within the aircraft 8.

A controller 44 and a communication system having a wireless communication link 45 may also be included in the aircraft 8. The controller 44 may be operably coupled to the air-conditioning system 20, nose wheel system 30, the plurality of other aircraft systems 40, as well as the various sensors, control mechanisms, etc. The controller 44 may also be connected with other controllers of the aircraft 8. The controller 44 may include memory 46, the memory 46 may include random access memory (RAM), read-only memory (ROM), flash memory, or one or more different types of portable electronic memory, such as discs, DVDs, CD-ROMs, etc., or any suitable combination of these types of memory. The controller 44 may include one or more processors 48, which may be running any suitable programs. The controller 44 may be a portion of an FMS or may be operably coupled to the FMS. Alternatively, the controller 44 may be a dedicated controller. Further, the controller 44 may be a single controller or multiple controllers on the multiple systems working together.

A computer searchable database of information may be stored in the memory 46 and accessible by the processor 48. The processor 48 may run a set of executable instructions to display the database or access the database. Alternatively, the controller 44 may be operably coupled to a database of information. For example, such a database may be stored on an alternative computer or controller. It will be understood that the database may be any suitable database, including a single database having multiple sets of data, multiple discrete databases linked together, or even a simple table of data. It is contemplated that the database may incorporate a number of databases or that the database may actually be a number of separate databases. The database may store data that may include historical air-conditioning system data for the aircraft 8 and be related to a fleet of aircraft. The database may also include reference values including threshold values, historic values, or aggregated values and data related to determining such reference values.

Alternatively, it is contemplated that the database may be separate from the controller 44 but may be in communication with the controller 44 such that it may be accessed by the controller 44. For example, it is contemplated that the database may be contained on a portable memory device and in such a case, the aircraft 8 may include a port for receiving the portable memory device and such a port would be in electronic communication with controller 44 such that controller 44 may be able to read the contents of the portable memory device. It is also contemplated that the database may be updated through the wireless communication link 45 and that in this manner, real time information may be included in the database and may be accessed by the controller 44.

Further, it is contemplated that such a database may be located off the aircraft 8 at a location such as an airline operation center, flight operations department control, or another location. The controller 44 may be operably coupled to a wireless network over which the database information may be provided to the controller 44.

While a commercial aircraft has been illustrated, it is contemplated that portions of the embodiments of the invention may be implemented anywhere including in a computer or controller 60 at a ground system 62. Furthermore, the database(s) as described above may also be located in a destination server or a controller 60, which may be located at and include the designated ground system 62. Alternatively, the database may be located at an alternative ground location. The ground system 62 may communicate with other devices including the controller 44 and databases located remote from the controller 60 via a wireless communication link 64. The ground system 62 may be any type of communicating ground system 62 such as an airline control or flight operations department.

It will be understood that the controller 44 and the controller 60 merely represent two exemplary embodiments that may be configured to implement embodiments or portions of embodiments of the invention. During operation, either the controller 44 and/or the controller 60 controller 44 and the controller 60 may be configured to receive the user input data and the operational data, wherein the controller executes a computer program implementing an algorithm that identifies a possible fault condition of the at least one aircraft component based on the operational data, analyze the user input data corresponding to the identified possible fault condition to determine when the user input data is symptomatic of the identified possible fault condition, identify an actual fault condition when the user input data is determined to be symptomatic of the identified possible fault condition, and provide an indication of the identified fault condition.

By way of non-limiting example, one or more sensors related to any of the components or systems may transmit data relevant to various characteristics of the system. The controller 44 and/or the controller 60 may utilize inputs from the control mechanisms, sensors, other aircraft systems, the database(s), and/or information from airline control or flight operations department to identify a possible fault condition. Among other things, the controller 44 and/or the controller 60 may analyze the data over time to determine drifts, trends, steps, or spikes in the operation of the monitored system. The controller 44 and/or the controller 60 may also analyze the sensor data and identify possible fault conditions in the system based thereon.

Once a possible fault condition within the system has been identified, the controller 44 and/or the controller 60 may analyze user input data related to the identified possible fault condition to determine if the user input data is symptomatic of the identified possible fault condition. At that time the controller 44 and/or the controller 60 may identify an actual fault condition when the user input data is determined to be symptomatic of the identified possible fault condition. An indication of the actual fault condition may then be provided on the aircraft 8 and/or at the ground system 62. It is contemplated that the identification of the actual fault condition may be done during flight, may be done post flight, or may be done after any number of flights. The wireless communication link 45 and the wireless communication link 64 may both be utilized to transmit data such that the possible fault condition and/or the actual fault condition may be identified by either the controller 44 and/or the controller 60.

One of the controller 44 and the controller 60 may include all or a portion of a computer program having an executable instruction set for identifying the possible fault condition and/or identifying the actual fault condition in the aircraft 8. The actual fault conditions may include improper operation of components as well as failure of components of the monitored system. Regardless of whether the controller 44 and/or the controller 60 runs the program for identifying the actual fault condition, the program may include a computer program product that may include machine-readable media for carrying or having machine-executable instructions or data structures stored thereon.

It will be understood that details of environments that may implement embodiments of the invention are set forth in order to provide a thorough understanding of the technology described herein. It will be evident to one skilled in the art, however, that the exemplary embodiments may be practiced without these specific details. The exemplary embodiments are described with reference to the drawings. These drawings illustrate certain details of specific embodiments that implement a module or method, or computer program product described herein. However, the drawings should not be construed as imposing any limitations that may be present in the drawings. The method and computer program product may be provided on any machine-readable media for accomplishing their operations. The embodiments may be implemented using an existing computer processor, or by a special purpose computer processor incorporated for this or another purpose, or by a hardwired system. Further, multiple computers or processors may be utilized including that the controller 44 and/or the controller 60 may be formed from multiple controllers. It will be understood that the controller identifying the actual fault condition may be any suitable controller including that the controller may include multiple controllers that communicate with each other.

As noted above, embodiments described herein may include a computer program product comprising machine-readable media for carrying or having machine-executable instructions or data structures stored thereon. Such machine-readable media may be any available media, which may be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium that can be used to carry or store desired program codes in the form of machine-executable instructions or data structures and that can be accessed by a general purpose or special purpose computer or other machine with a processor. When information is transferred or provided over a network or another communication connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions comprise, for example, instructions and data, which cause a general-purpose computer, special purpose computer, or special purpose processing machines to perform a certain function or group of functions.

Embodiments will be described in the general context of method steps that may be implemented in one embodiment by a program product including machine-executable instructions, such as program codes for example, in the form of program modules executed by machines in networked environments. Generally, program modules include routines, programs, objects, components, data structures, etc., that have the technical effect of performing particular tasks or implement particular abstract data types. Machine-executable instructions, associated data structures, and program modules represent examples of program codes for executing steps of the method disclosed herein. The particular sequence of such executable instructions or associated data structures represent examples of corresponding acts for implementing the functions described in such steps.

Embodiments may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the internet and may use a wide variety of different communication protocols. Those skilled in the art will appreciate that such network computing environments will typically encompass many types of computer system configurations, including personal computers, hand-held devices, multiprocessor systems, microprocessor-based or programmable consumer electronics, network PCs, mini-computers, mainframe computers, and the like.

Embodiments may also be practiced in distributed computing environments where tasks are performed by local and remote processing devices that are linked (either by hardwired links, wireless links, or by a combination of hardwired or wireless links) through a communication network. In a distributed computing environment, program modules may be located in both local and remote memory storage devices.

Figure 2:
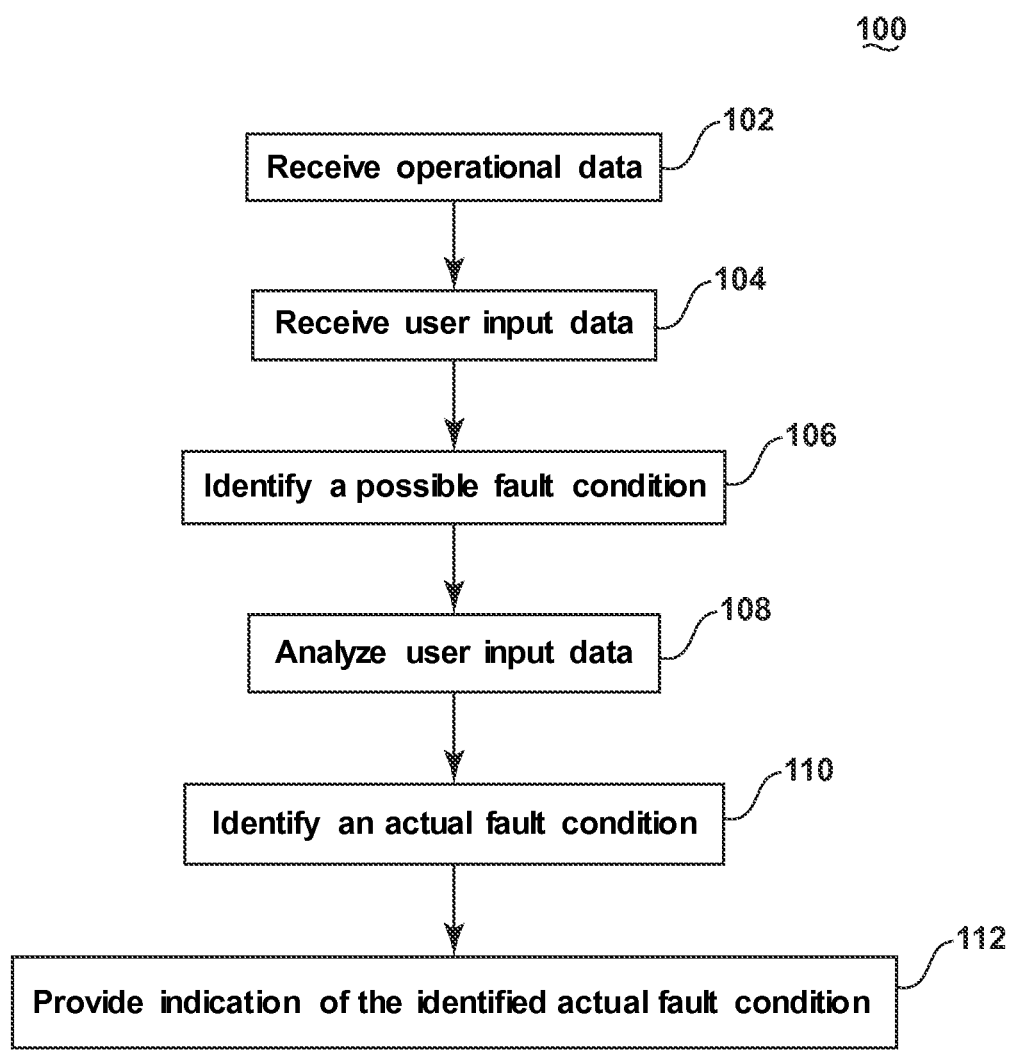
FIG. 2 is a flowchart showing a method of identifying a fault according to an embodiment of the invention

In accordance with an embodiment of the invention, FIG. 2 illustrates a method 100, which may be used for identifying an actual fault condition in the aircraft 8; such an identified actual fault condition may include a failure. It will however be understood that the identified actual fault condition may not be a failure but instead may be a condition that alerts maintenance personal to go look at the identified issue. In this manner, the identified actual fault condition may indicate a fault condition is present, but is not a guarantee that an actual fault exists.

The method 100 begins at 102 by receiving operational data from a plurality of sensors for the at least one monitored system during at least a portion of a flight. It will be understood that such operational data may be passively received by the controller 44 or that the controller 44 may actively obtain data from the sensors associated with the monitored system. The operational data may be received during any of the flight phases including those on the ground and in the air. The operational data may also be received for any number of flight phases including a single phase and multiple phases. The phases of flight include taxiing, take-off, ascent, cruise, descent, and landing.

It is contemplated that the received data may include raw data from which a variety of other information may be derived or otherwise extracted to define the sensor output. It will be understood that regardless of whether the sensor output is received directly or derived from received output, the output may be considered received data. For example, the sensor output may be aggregated over time to define aggregated sensor data. Aggregating the received sensor output over time may include aggregating the received sensor output over multiple phases of flight and/or over multiple flights. Such aggregated sensor data may be reset after a maintenance event. For example, a possible fault condition may be based on derived data such as medians, minima, maximum values, standard deviations, counts above or below thresholds, change of state, correlations, etc., that may be calculated per phases of the flight of the aircraft or over multiple phases of flight.

At 104, user input data may be received from a user input corresponding to the operation of the at least one monitored system. This may also include receiving data from one or more sensors related to the control mechanisms or other user inputs related to the monitored system during at least a portion of a flight. As with the operational data, the user input data may be received during any flight phase including multiple flight phases.

It is contemplated that the user input data may be normalized in any suitable manner. Examples may include: normalizing the time scale to range from −0 to 1, so that flights where a particular flight phase's duration varied can be compared together; normalizing by cancelling an offset due to another control setting, normalizing by cancelling an offset due to external factors; using a control parameter as an x-axis parameter rather than time; etc. For example, in a take-off profile, plotting various parameters with the ground speed on the x-axis, rather than time; so that different flights where the take-off acceleration's duration varied can be compared with each other At 106, a possible fault condition may be identified based on comparing the received operational data to at least one corresponding threshold. It will be understood that the operational data may not be compared directly to the threshold; instead, the operational data may be processed by an algorithm first and the output of the algorithm may be compared to the corresponding threshold. This will still be considered to be the received operational data being compared to a corresponding threshold. An example of suitable algorithms, may include calculating a median, min, max, mean, difference with another parameter, delay between events in different parameters, identification of shifts, noise, any combination of those, etc. The at least one corresponding threshold may be any suitable threshold related to the sensor output including predetermined thresholds, historical reference values, etc. Furthermore, the at least one corresponding threshold may include values that have been determined during flight such as another sensor reading. In this manner, it will be understood that the at least one corresponding threshold may be defined during operation. Alternatively, the at least one corresponding threshold may be stored in one of the database(s) as described above.

In this manner, sensor output may be compared to corresponding thresholds and any suitable comparison may be made. For example, the comparison may include determining a difference between the sensor output and the corresponding threshold. By way of non-limiting example, the comparison may include comparing a recent signal output to a historic value. Comparisons may be made on a per flight basis or the data may be processed over a series of uses of the system or over a series of flights.

A possible fault condition may be identified when the comparison indicates that the operational data satisfies the corresponding threshold. The term "satisfies" the threshold is used herein to mean that the operational data satisfies the predetermined threshold, such as being equal to, less than, or greater than the threshold value. It will be understood that such a determination may easily be altered to be satisfied by a positive/negative comparison or a true/false comparison. For example, a less than threshold value can easily be satisfied by applying a greater than test when the data is numerically inverted. It will be understood that any number of possible fault conditions may be identified based on any number of comparisons.

At 108, the user input data corresponding to the identified possible fault condition may be analyzed to determine when the user input data is symptomatic of the identified possible fault condition. In this manner, the method utilizes both operational data and actual aircrew inputs to determine an actual fault condition. That is, the operational data provides a first check to identify areas to look for a fault condition. The second check, with user input, determines if a fault conditions exists in the areas being monitored. More specifically, at 110, an actual fault condition may be identified by the controller 44 and/or the controller 60 when the user input data is determined to be symptomatic of the identified possible fault condition. Thus, at 106 the operational data is used to determine possible "candidates" for a fault condition. Such candidates are then monitored, along with the user input data, to determine if there is a fault condition for one of the monitored candidates. In this manner, the operational data is like a first level filter. It lets pass through those items that might be having a fault condition but a final determination is not made that an actual fault condition does exist until the user input data is looked at in a confirming step.

In implementation, the threshold values for the operational data, comparisons, and information regarding when user input data is symptomatic of a fault, may be converted to an algorithm to identify actual fault conditions in the monitored system of the aircraft. Such an algorithm may be converted to a computer program comprising a set of executable instructions, which may be executed by the controller 44 and/or the controller 60. Various other parameters recorded by onboard systems such as altitude, valve settings, etc., may also be utilized by such a computer program to identify actual fault conditions in the monitored system of the aircraft. Alternatively, the computer program may include a model, which may be used to identify actual fault conditions in the monitored system of the aircraft. A model may include the use of reasoning networks, flow charts, or decision trees. The model may be implemented in software as an algorithm, such as one or more mathematical algorithms. Identification of the possible or actual fault conditions may be based upon understanding of the system and patterns in the data compared to previous faults. The model may ensure all information available is used and may discount false positives.

At 112, the controller 44 and/or the controller 60 may provide an indication of the actual fault condition in the aircraft 8 identified at 110. The indication may be provided in any suitable manner at any suitable location including in the cockpit 16 and at the ground system 62. For example, the indication may be provided on a primary flight display (PFD) in a cockpit 16 of the aircraft 8. If the controller 44 ran the program, then the suitable indication may be provided on the aircraft 8 and/or may be uploaded to the ground system 62. Alternatively, if the controller 60 ran the program, then the indication may be uploaded or otherwise relayed to the aircraft 8. Alternatively, the indication may be relayed such that it may be provided at another location such as an airline control or flight operations department.

It will be understood that the method of identifying the actual fault condition is flexible and the method illustrated is merely for illustrative purposes. For example, the sequence of steps depicted is for illustrative purposes only, and is not meant to limit the method 100 in any way, as it is understood that the steps may proceed in a different logical order or additional or intervening steps may be included without detracting from embodiments of the invention. For example, the method may include monitoring the operational data corresponding to the identified possible fault condition for multiple uses of the at least one monitored system. The possible fault condition could then be confirmed over a number of uses of the system. Including that the possible fault condition could be identified if it is identified so many times within a set number of uses and would otherwise be discarded as a possible fault condition. Further still, the operational data may be received for a plurality of flights and identifying the possible fault condition may include identifying the possible fault condition when the comparing indicates thresholds are satisfied over multiple flights. It is contemplated that receiving user input data may include receiving or sensing aircrew behavior during multiple uses of the system. The aircrew behavior may then be averaged to define an average aircrew behavior or may be otherwise statistically manipulated. The received aircrew behavior(s) may also be normalized prior to the averaging.

Several specific examples may provide additional useful details on embodiments of the invention. With respect to the nose wheel system 30, receiving operational data may include that a nose wheel steering angle and sensor offsets may be monitored to identify anomalies in system performance or health based on both in-flight and on-ground flight regimes. Receiving user input data from a user input corresponding to the operation of the at least one monitored system may include receiving data such as position of the steering wheel and pedals. Such user input data may be analyzed during the take-off roll to detect consistent crew behavioral patterns that could indicate a steering offset. It will be understood that the average pattern of aircraft behavior may be analyzed over a large number of flights in order to cancel any effect of side-winds or an effect of a particular runway.

Operational data that may be monitored may include a position of the nose wheel according to one or more sensors including either from a control or monitoring channel, a position of the rudder, a body yaw rate of the aircraft, a ground speed of the aircraft, a state of the nose landing gear (i.e. whether it is on ground or not), a position of the nose landing gear (i.e. retracted or not). Identifying a possible fault condition based on comparing the received operational data to at least one corresponding threshold may include identifying a possible fault condition when there is discrepancy between the two sensors reading the nose wheel position in pre-flight, cruise, and/or post-flight.

A possible fault condition may be identified based on the operational data including a position of the nose wheel when the yaw rate is zero and the ground speed is in a certain range (5-20 kts), in pre-flight and post-flight. A possible fault condition may be identified based on a position of the wheel in cruise and/or a position of the wheel during take-off acceleration. More specifically, the above may highlight some anomalies in the nose wheel system 30 such as the two sensors 34 disagreeing. It could mean that the monitor sensor is offset or the control sensor is offset. In this manner, the method may identify multiple possible fault conditions based on the received operational data.

Applicants have determined that having an offset in the control sensor would mean that during the acceleration at take-off, the pilot would have to apply some rudder pedal at low speeds to keep the wheel straight. As the speed of the aircraft increases, this effect would reduce as the wheel has less influence and the rudder takes over; so the pilot input on the rudder should decrease as the speed increases. In this manner, steering data is the user input data that corresponds to the identified possible fault condition. When, in multiple flights, pilots have to apply steering in the same direction to keep the plane straight, regardless of the individual pilot, the airport, and the cross winds, then the user input data (the above-described steering) is symptomatic of the identified possible fault condition. In the above example, the actual fault condition is identified as a fault condition with the control sensor. More specifically, the fault may be identified as a steering command sensor offset. This also allows for effects, which such a fault may cause, to be predicted including potential nose wheel vibration.

Another example, will be explained with respect to the air-conditioning system 20. Receiving operational data may include cabin temperatures in different areas of the aircraft, a temperature in the ducts 24, position of trim air valves, a temperature in different parts of the air-conditioning system 20, such as a water extractor, a pack outlet, etc., a position of valves in the air conditioning pack, e.g. bypass valve, inlet valve, an ambient temperature, etc. Multiple temperature sensor readings may be transmitted from temperature sensors 42 coupled to the air-conditioning system 20. This may include sequentially and/or simultaneously transmitting data from the sensors 42. The transmitted data may be received by any suitable device including a database or the controller 44 and/or the controller 60. Statistics including median values may be derived for each of the above parameters during flight phases such as pre-flight, cruise, and post-flight.

Further still, comparing the operational data to a reference value or threshold may include determining a difference between related temperatures in the air-conditioning system 20 and then comparing that difference to a reference difference value. For example, deltas between adjacent and/or related temperatures may be used to highlight anomalous temperature measurements. The deltas allow normalization of the cabin compartment temperatures since, it is assumed, actual cabin temperatures across the different compartments will not vary significantly at any one time. This will reduce the effect of the variability observed in cabin compartment temperatures in normal operation, for example, the variability observed in certain phases, for example, pre-flight, due to seasonal variations. Any significant variation of one compartment temperature with another can identify a possible fault condition in that sensor\system.

Receiving user input data from a user input corresponding to the operation of the air-conditioning system 20 may include receiving data such as temperature setting selection by the aircrew. The aircrew can compensate for non-optimal air conditioning system performance by increasing or reducing cabin set temperatures. Such user input data may be analyzed during any phase of flight including all phases of flight. For example, user input may show a change in temperature settings that varies a lot during the flight, due to the aircrew being unable to achieve the right temperature, alternatively too hot or too cold. This could depend on the given aircrew so it will be understood that the aircrew behavior may be analyzed over a large number of flights in order to normalize any anomalies. Another type of behavior is that the crew consistently sets the temperature to a minimum value in an attempt to bring the temperature to a normal level. If a pack worked properly, the aircrew should never select the minimum value, as this would result in a very low cabin temperature. Therefore, a fault condition with one of the packs may be identified. In this manner, performance indicators derived from recorded air conditioning system operational data may be fused with aircrew behavioral patterns associated with cabin temperature settings to identify faults in the air conditioning system. Utilizing both the operational parameters and the aircrew behavior patterns, which may also be derived from recorded flight data, enhances system fault identification capabilities.

While it would be possible to derive aircrew behavior in a non-automated way, such as through interviews, as opposed to deriving it from user inputs, this would be limited to actions consciously taken by the aircrew. This would also require that the aircrew remember and report such actions. By automatically receiving user inputs, aircrew behaviors that are unconscious but indicative of an aircraft fault may be received and analyzed.

Technical effects of the above-described embodiments include that analytical system fault detection may be combined with analysis of aircrew behavior to identify aircraft component and system possible and/or actual fault conditions with increased confidence. There are many potential root causes of aircraft faults and often insufficient sensing of the aircraft systems to allow discrimination between the multiple possible causes of these faults. For example, currently existing troubleshooting manuals may include a list of multiple possible causes. The above-described embodiments take into account both system data with averaged crew behavioral patterns, which results in significantly better fault discrimination than is possible with existing techniques. Data is not currently combined in this manner. Aggregating and averaging aircrew behavior over multiple flights for troubleshooting aircraft faults provides additional benefits. The above-described embodiments allow root causes to be identified directly, which in turn saves effort and cost associated with extended troubleshooting and maintenance. This reduces maintenance times and the operational impact of faults and issues in an aircraft. Particularly there may be a reduction in the time required to identify an issue and issues may be identified accurately. This allows for cost savings by reducing maintenance cost, rescheduling cost, and minimizing operational impacts including minimizing the time aircraft are grounded.

To the extent not already described, the different features and structures of the various embodiments may be used in combination with each other as desired. Some features may not be illustrated in all of the embodiments, but may be implemented if desired. Thus, the various features of the different embodiments may be mixed and matched as desired to form new embodiments, whether or not the new embodiments are expressly described. All combinations or permutations of features described herein are covered by this disclosure.

This written description uses examples to disclose embodiments of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of identifying a fault in an aircraft having at least one monitored system, the method comprising:
   receiving, at a controller, operational data from at least one sensor for the at least one monitored system during at least a portion of a flight;
   receiving, at the controller, user input data derived from aircrew behavior corresponding to the operation of the at least one monitored system;
   analyzing, at the controller, the operational data to identify a possible fault condition, wherein identifying the possible fault condition is based on comparing the operational data to at least one corresponding threshold related to the at least one sensor, and identifying the possible fault condition provides a data filter for the controller;
   analyzing, at the controller, the user input data corresponding to the possible fault condition to determine the user input data is symptomatic of the possible fault condition;
   in response to determining the user input data is symptomatic of the possible fault condition, identifying, by the controller, an actual fault condition; and
   providing an indication of the actual fault condition.

2. The method of claim 1, further comprising monitoring the operational data corresponding to the possible fault condition for multiple uses of the at least one monitored system.

3. The method of claim 1 wherein the operational data comprises operational data from the at least one sensor aggregated over a plurality of flights.

4. The method of claim 1 wherein the indication is an alert regarding the actual fault condition provided on a display within the aircraft.

5. The method of claim 3, further comprising receiving the user input data during multiple uses of the system over a plurality of flights.

6. The method of claim 5, further comprising averaging the user input data to define an average user input data.

7. The method of claim 6, further comprising normalizing the user input data prior to the averaging.

8. The method of claim 1, further comprising normalizing the user input data prior to identifying the actual fault condition.

9. The method of claim 1 wherein the monitored system is a nose wheel system of the aircraft and the operational data comprises at least one of a position of a nose wheel, a position of a rudder, a body yaw rate of the aircraft, a ground speed of the aircraft, a state of a nose landing gear, or a position of the nose landing gear.

10. The method of claim 9 wherein the user input data comprises sensing a rudder pedal usage at multiple speeds.

11. The method of claim 1 wherein the monitored system is an air conditioning system of the aircraft and the operational data comprises at least one of cabin temperatures in different areas of the aircraft, a temperature in a duct of the air conditioning system, a position of trim air valves, a temperature in a water extractor, or a pack outlet of the air conditioning system.

12. The method of claim 11 wherein receiving the user input data comprises sensing temperature settings selected by an aircrew.

13. The method of claim 12 wherein the user input data comprises sensing the aircrew setting a temperature to a minimum value.

14. The method of claim 1 wherein the operational data and the user input data is acquired during multiple phases of flight.

15. The method of claim 1 wherein the controller utilizes an algorithm to identify the actual fault condition.

16. A system for identifying a fault in an aircraft comprising:
   at least one aircraft component or system having at least one sensor outputting operational data for the at least one aircraft component or system;
   at least one user input device located on the aircraft and providing user input data corresponding to operation of the at least one aircraft component or system;
   a controller receiving the user input data and the operational data, wherein the controller:
      identifies a possible fault condition of the at least one aircraft component or system by comparing the operational data to at least one corresponding threshold related to the at least one sensor;
      monitors the operational data corresponding to possible fault condition for multiple uses of the at least one aircraft component or system;
      analyzes the user input data corresponding to the possible fault condition to determine when the user input data is symptomatic of the possible fault condition;
      identifies an actual fault condition when the user input data is determined to be symptomatic of the possible fault condition; and
      providing an indication of actual fault condition.

* * * * *